(12) United States Patent
Adalsteinsson et al.

(10) Patent No.: US 8,866,478 B2
(45) Date of Patent: Oct. 21, 2014

(54) METHOD AND PROCESSOR AND MAGNETIC RESONANCE APPARATUS FOR DESIGNING RF PULSES TO MITIGATE OFF-RESONANCE EFFECTS

(75) Inventors: Elfar Adalsteinsson, Belmontt, MA (US); Hans-Peter Fautz, Forchheim (DE); Kawin Setsompop, Charlestown, MA (US); Lawrence Wald, Cambridge, MA (US)

(73) Assignees: Siemens Aktiengesellschaft, Munich (DE); The General Hospital Corp., Boston, MA (US); Massachusetts Institute of Technology, Cambridge, MA (US)

( * ) Notice: Subject to any disclaimer, the term of this patent is extended or adjusted under 35 U.S.C. 154(b) by 547 days.

(21) Appl. No.: 13/181,868

(22) Filed: Jul. 13, 2011

(65) Prior Publication Data

US 2013/0015854 A1 Jan. 17, 2013

(51) Int. Cl.
*G01V 3/00* (2006.01)
*G01R 33/565* (2006.01)
*G01R 33/561* (2006.01)
*G01R 33/56* (2006.01)
*G01R 33/44* (2006.01)

(52) U.S. Cl.
CPC ...... *G01R 33/56563* (2013.01); *G01R 33/5612* (2013.01); *G01R 33/5614* (2013.01); *G01R 33/5607* (2013.01); *G01R 33/446* (2013.01)
USPC .......................................... 324/314; 324/309

(58) Field of Classification Search
USPC .................. 324/314, 309, 307, 312
See application file for complete search history.

(56) References Cited

U.S. PATENT DOCUMENTS

| 6,853,192 | B2 * | 2/2005 | Heid | 324/314 |
|---|---|---|---|---|
| 8,063,637 | B2 * | 11/2011 | Xu et al. | 324/314 |
| 8,159,222 | B2 * | 4/2012 | King et al. | 324/309 |
| 8,228,062 | B2 * | 7/2012 | Sharp et al. | 324/309 |
| 2010/0066362 | A1 | 3/2010 | Ullmann | |
| 2010/0253336 | A1 | 10/2010 | Schneider et al. | |
| 2010/0286500 | A1 | 11/2010 | Ruhm | |

OTHER PUBLICATIONS

Pauly et al., "A k-Space Analysis of Small-Tip-Angle Excitation", Journal of Magnetic Resonance, vol. 81 (1989) pp. 43-56.

(Continued)

*Primary Examiner* — Louis Arana
(74) *Attorney, Agent, or Firm* — Schiff Hardin LLP

(57) ABSTRACT

In a magnetic resonance apparatus and operating method therefor, and in a processor that is programmed to design RF pulses for operating such a magnetic resonance apparatus, the RF pulses are designed to mitigate off-resonance effects caused by inhomogeneity of the basic (B0) magnetic field in the magnetic resonance apparatus. The RF pulses of a parallel transmit array are designed with different spatial phase distributions, that deviate from a constant phase from pulse-to-pulse, with the absolute value of the difference between respective spatial phase distributions of any two successively radiated RF pulses corresponding to the off-resonance that is caused by B0-inhomogeneity during the time between the radiation of the successive pulses. Additionally, or separately, currents supplied to the shim coils can be taken into account in the design of the RF pulses as an additional degree of freedom, with the shimming of the basic magnetic field produced by the shim currents deviating from shim currents designed to ideally produce a homogenous B0 field.

15 Claims, 2 Drawing Sheets

(56) References Cited

OTHER PUBLICATIONS

Grissom et al., "Spatial Domain Method for the Design of RF Pulses in Multicoil Parallel Excitation", Magnetic Resonance in Medicine, vol. 56 (2006) pp. 620-629.

Macovski, "Three-Dimensional Spectral-Spatial Excitation", Magnetic Resonance in Medicine, vol. 37 (1997) pp. 378-388.

Setsompop et al., "Magnitude Least Squares Optimization for Parallel Radio Frequency Excitation Design Demonstrated at 7 Tesla With Eight Channels", Magnetic Resonance in Medicine, vol. 59 (2008) pp. 908-915.

Setsompop et al., "Slice-Selective RF Pulses for in Vivo B1+ Inhomogeneity Mitigation at 7 Tesla Using Parallel RF Excitation With a 16-Element Coil", Magnetic Resonance in Medicine, vol. 60 (2008) pp. 1422-1432.

Katscher et al. "Transmit SENSE", Magnetic Resonance in Medicine, vol. 49 (2003) pp. 144-150.

Ibrahim et al., "Application of finite difference time domain method for the design of birdcage RF head coils using multi-port excitations", Magnetic Resonance Imaging, vol. 18 (2000) pp. 733-742.

\* cited by examiner

METHOD AND PROCESSOR AND MAGNETIC RESONANCE APPARATUS FOR DESIGNING RF PULSES TO MITIGATE OFF-RESONANCE EFFECTS

This invention was made with government support under Grant No. R01 EB 007942 awarded by the National Institute of Health. The Government has certain rights in the invention.

BACKGROUND OF THE INVENTION

1. Field of the Invention

The present invention concerns magnetic resonance imaging systems, and operating methods therefor, wherein radio-frequency (RF) pulses are designed for use in exciting nuclear spins in order to obtain magnetic resonance image data. The method also concerns a computerized processor programmed to design such RF pulses.

2. Description of the Prior Art

The spectral response of a spin system to a train of RF pulses may crucially define the content of the received MR signal and therefore image quality. Particularly if the MR application relies on a coherent and defined phase evolution of transversal magnetization between two successive RF pulses (as in TrueFISP or frequency selective RF pulses) spatial variations of the B0 field, or equivalently, the resonance frequency, may lead to unwanted local signal behavior and image degradation. Examples of commonly used MRI methods where the detrimental effect of B0 field inhomogeneity is particularly apparent include TrueFISP, chemical-shift selective RF pulses, and spectral-spatial RF pulses. For TrueFISP, off-resonance effects lead to well known dark stripe artifacts in regions where transversal magnetization accumulates a phase of $(2n+1)*180°$ between two successive excitation pulses due to off-resonance (n=1,2,3, . . . ). For chemical shift selective RF pulses such as those for fat suppression in imaging or spectroscopy or water suppression pulses in spectroscopy, dephasing between sub-pulses due to off-resonance lead to incomplete excitation for frequencies to be excited and partial excitation of frequencies not to be excited.

Artifacts due to off-resonance in spectrally sensitive sequences or pulses are typically addressed by optimizing field adjustments due to so-called shim coils that produce linear and higher-order spatial field variations. This procedure, or shimming, while helpful, never fully removes the effects of undesired spatial variation in the static magnetic field, mostly since the field variations due to susceptibility variations in the subject are of substantially higher order than are available in commercial shim systems (which are often limited to 2nd order) and therefore fundamentally not amenable to shimming. Further hardware enhancements like higher-order shimming yields to expensive systems with high current demands. Other means to mitigate the detrimental effects of residual B0 inhomogeneity are tailored to each specific application, and include, cases where the pulse or sub pulse spacing is not restricted to a specific timing, it might be optimized to reduce artifacts like in TrueFISP, where the repetition time is chosen as short as possible to minimize de-phasing time for off-resonance magnetization. Other examples of B0 inhomogeneity mitigation in spectrally-selective pulses include 3D spectral-spatial pulses where the design offers a degree of control of the spectral passband as a function of spatial coordinates Morrell G, Macovski A. "Three-dimensional Spectral-Spatial Excitation.," Magn. Reson. Med. 37(3): pgs 378-386; 1997. Mitigation of B0 effects in parallel transmission (pTx) by incorporating off-resonance maps as design constraints in pulse optimization is described in Setsompop K, Wald L L, Alagappan V, Gagoski B A, Adalsteinsson E. "Magnitude Least Squares Optimization for Parallel Radio Frequency Excitation Design Demonstrated at 7 Tesla with Eight Channels," Magn. Reson. Med. 59(4): pgs 908-915; 2008; and Setsompop K, Alagappan V, Gagoski B, Witzel T, Polimeni J, Potthast A, Hebrank F, Fontius U, Schmitt F, Wald L L, Adalsteinsson E. "Slice-Selective RF Pulses for In Vivo B1+ Inhomogeneity Mitigation at 7 Tesla Using Parallel RF Excitation with a 16– Element Coil," Magn. Reson. Med. 60(6): pgs 1422-1432; 2008.

Moreover, current RF pulse design methods allow for exciting magnetization with spatially pre-defined magnitude and phase within the transversal plane. This is either achieved by a complex superposition of RF fields from multiple antennas with certain amplitude and phase relation (e.g. Ibrahim T S, Lee R, Baertlein A B, Kangarlu A, Robitaille P M L. "Application of Finite Difference Time Domain Method for the Design of Birdcage RF Head Coils Using Multi-Port Excitations," Magn. Reson. Imaging 18: pgs 733-742; 2000) or by playing out gradient fields simultaneously to RF transmission (e.g. Pauly J, Nishimura D, Macovski A. "A K-space Analysis of Small Tip Angle Excitation," JMR 81: pgs 43-56; 1989.) or a combination of both, which enables the acceleration of RF pulses with spatially tailored excitation patterns (e.g. Katscher U, Bornert P, Leussler C, van den Brink J S. "Transmit SENSE," Magn. Reson. Med 49(1) pgs 144-150, 2003) through the reduced pulse duration.

SUMMARY OF THE INVENTION

An object of the present invention is to provide a method and processing system, which may be a stand-alone processor or a part of the computerized control and processing system of a magnetic resonance system to design RF pulses in order to mitigate off-resonance effects.

The above object is achieved in accordance with the present invention in a method, computerized processor, and magnetic resonance system that make use of known pulse design algorithms for designing pulses but with different spatial phase distributions. This differs from current design methods where the phase term is either constant over space, or relaxed to enable smooth but otherwise unspecified spatial variation. An example of pulse design where the phase term could explicitly be specified to mitigate off-resonance effects is to make the spatial phase distribution of RF pulse or sub-pulse n relative to the spatial distribution of RF pulse or sub-pulse n-1 equal the spatial distribution of phase evolutions induced by B0 off-resonances between the two RF pulses or sub-pulses n-1 and n. For a train of equidistant RF pulses or sub-pulses the phase of any voxel would be increased linearly from pulse to pulse according to the off-resonance in this voxel. With this approach, the phase of the RF excitation tracks the temporal evolution of the B0 inhomogeneity and therefore mitigates its adverse effects on the pulse performance.

Spatial phase patterns that are generated by means of B1 fields (or B1 fields in conjunction with gradient fields) have to match phase patterns stemming from the B0 field distribution. The B0 field distribution is typically optimized toward uniformity using B0 shim fields. However, in accordance with the invention it can be beneficial to optimize the B0 shim toward a field distribution that can be matched by the B1 field distribution of the applied RF pulses. The B0 shim values (currents through the shim or gradient coils) can be incorporated into the RF pulse design as additional degrees of freedom to be optimized, so as to offer the pulse designer the joint optimization space of RF channels, gradients ("linear shim terms"), and all available non-linear field-variation terms (e.g. shim terms).

DESCRIPTION OF THE PREFERRED EMBODIMENTS

Figure 1:
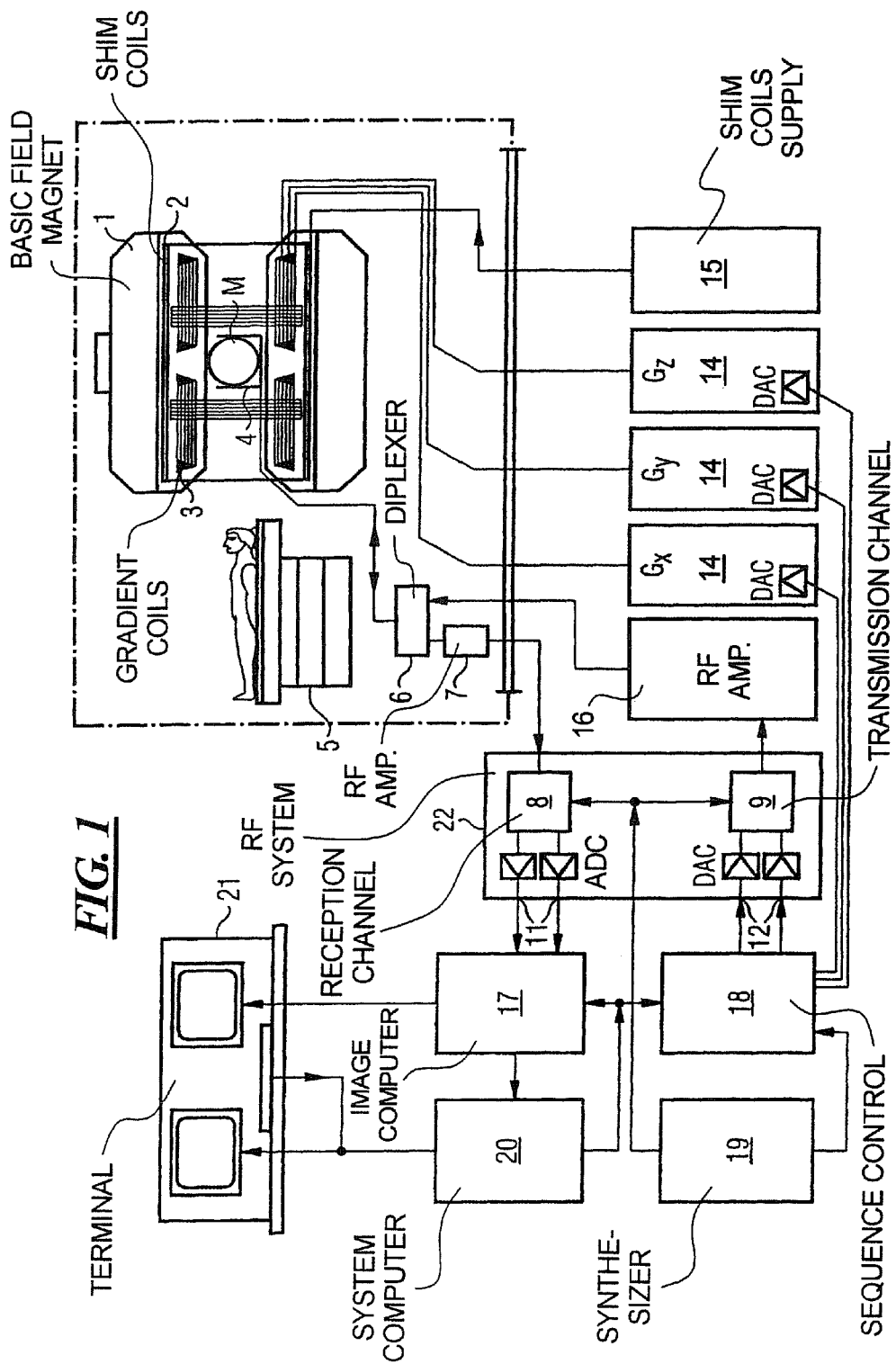
FIG. 1 schematically illustrates the basic components of a magnetic resonance imaging system constructed and operating in accordance with the present invention.

FIG. 1 schematically illustrates a magnetic resonance tomography apparatus in which gradient pulses according to the present invention are generated. The design of the magnetic resonance tomography apparatus corresponds to a conventional tomography apparatus, with the exceptions discussed below. A basic field magnet 1 generates a temporally constant strong magnetic field for polarization or alignment of the nuclear spins in the examination region of the subject such as, for example, a part of a human body to be examined. The high homogeneity of the basic magnetic field necessary for the magnetic resonance data acquisition is defined in a spherical measurement volume M in which the parts of the human body to be examined are introduced. For support of the homogeneity requirements, and in particular for elimination of temporally invariable influences, shim plates made from ferromagnetic material are mounted at a suitable location. Temporally variable influences are eliminated by shim coils 2 that are activated by a shim current supply 15.

A cylindrical gradient coil system 3 that is composed of three coils (windings) is used in the basic field magnet 1. Each coil is supplied with current by an amplifier 14 for generation of a linear gradient field in the respective direction of the Cartesian coordinate system. The first coil of the gradient field system 3 generates a gradient $G_x$ in the x-direction, the second coil generates a gradient $G_y$ in the y-direction and the third coil generates a gradient $G_z$ in the z-direction. Each amplifier 14 has a digital-analog converter that is activated by a sequence controller 18 for time-accurate generation of the gradient pulses.

Located within the gradient field system 3 is a radio-frequency antenna arrangement 4 that converts the radio-frequency pulses emitted by a radio-frequency power amplifier 16 into a magnetic alternating field for excitation of the nuclei and alignment of the nuclear spins of the subject to be examined, or of the region of the subject to be examined. The radio-frequency antenna arrangement 4 is a parallel transmit array, as explained in more detail below in connection with FIG. 2.

The alternating field originating from the precessing nuclear spins (i.e. normally the nuclear spin echo signals caused by a pulse sequence composed of one or more radio-frequency pulses and one or more gradient pulses) is also converted by the radio-frequency antenna arrangement 4 into a voltage that is supplied via an amplifier 7 to a radio-frequency receiver channel 8 of a radio-frequency system 22.

The radio-frequency system 22 furthermore has transmission channels 9 in which are generated the radio frequency pulses for the excitation of the nuclear spins, the pulse being respectively supplied via different channels to the coils of the radio-frequency antenna arrangement 4. The respective radio-frequency pulses are digitally represented as a series of complex numbers conforming to a pulse sequence predetermined in the sequence controller 18 by the system computer 20. This number series is supplied as a real part and an imaginary part via respective inputs 12 to a digital-analog converter (DAC) in the radio-frequency system 22 and, from this, to respective transmission channels 9. In the transmission channels 9, the pulse sequences are modulated with a radio-frequency carrier signal whose base frequency corresponds to the resonance frequency of the nuclear spins in the measurement volume.

Switchover from transmission mode to reception mode ensues with a transmission-reception diplexer 6. The radio-frequency antenna arrangement 4 radiates the radio-frequency pulses into the measurement volume M for excitation of the nuclear spins and samples resulting echo signals. The acquired nuclear magnetic resonance signals are phase-sensitively demodulated in the reception channel 8 of the radio-frequency system 22 and converted into a real part and an imaginary part of the measurement signal in a respective analog-digital converter. An image is reconstructed by an image computer 17 from the measurement data so acquired. The administration of the measurement data, the image data and the control programs ensues via a system computer 20. Based on control programs, the sequence controller 18 monitors the generation of the respectively desired pulse sequences and the corresponding sampling of k-space. The sequence controller 18 controls the time-accurate switching of the gradients, the emission of the radio-frequency pulses with defined phase and amplitude and the receipt of the magnetic resonance signals. The time base for the radio-frequency system 22 and the sequence controller 18 is provided by a synthesizer 19. The selection of corresponding control programs for generation of a nuclear magnetic resonance image as well as the representation of the generated magnetic resonance image ensues via a terminal 21 that has a keyboard as well as one or more screens.

Figure 2:
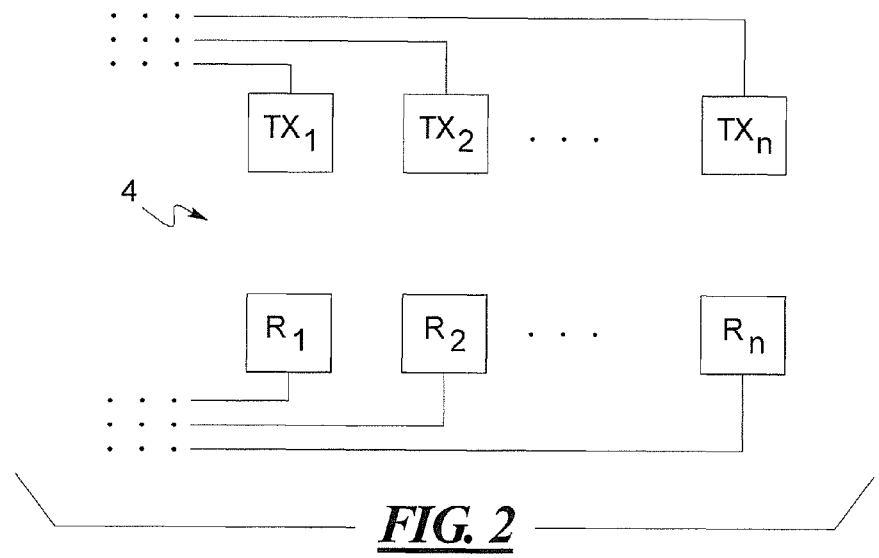
FIG. 2 schematically illustrates a parallel transmit RF antenna array suitable for use in accordance with the present invention.

FIG. 2 schematically illustrates a parallel transmission array that can be used in accordance with the present invention as the antenna arrangement 4. Various types of parallel transmission arrays are known in the art, and therefore FIG. 2 only schematically illustrates the basic concept of such an array. The array shown in FIG. 2 has multiple transmission coils $TX_1, TX_2 \ldots TX_n$, each being connected to an individual transmission channel via which signals are supplied to the respective coils $TX_1, TX_2 \ldots TX_n$ to cause those coils to individually radiate RF energy. The RF energy radiated by the respective coils $TX_1, TX_2 \ldots TX_n$ may be identical in terms of power and field distribution, or may be selectively different, in order to selectively configure the overall RF field distribution (pattern) that is generated in which the examination subject is located.

FIG. 2 also illustrates reception coils $R_1, R_2 \ldots R_n$, that respectively magnetic resonance signals that are produced as a result of the excitation of spins in the examination subject by the RF fields radiated by the transmit coils $TX_1, TX_2 \ldots TX_n$. Although separately shown in the schematic illustration of FIG. 2, the reception coils $R_1, R_2 \ldots R_n$ may be the same coils as the transmit coils $TX_1, TX_2 \ldots TX_n$, operated at respectively different times in a transmit mode and in a reception mode.

Figure 3:
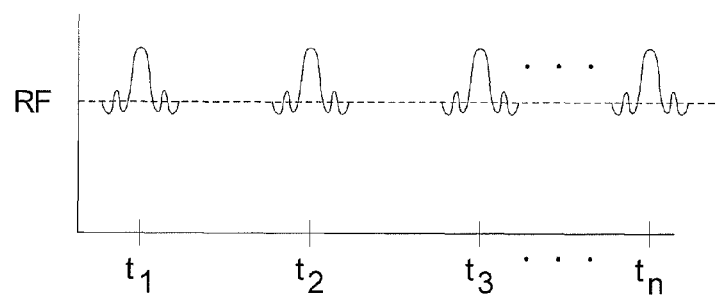
FIG. 3 schematically illustrates radio-frequency pulses or sub-pulses on a time line, generated with a parallel transmission array.
Figure 4:
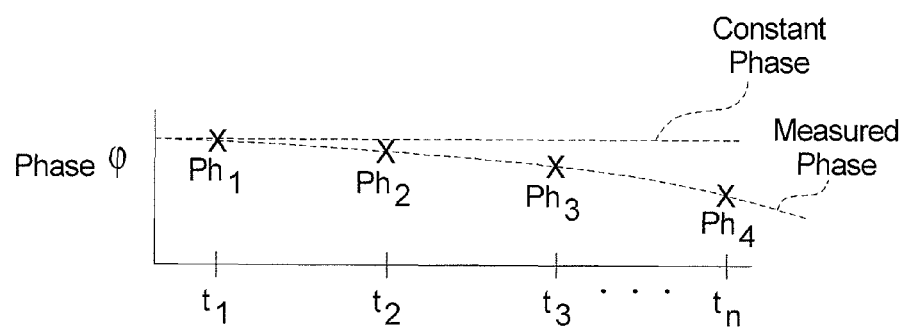
FIG. 4 illustrates the off-resonance effect on the respective phases of the pulses or sub-pulses shown in FIG. 2, compared to a constant phase.

FIG. 3 schematically illustrates the emission of RF pulses by the parallel transmit array shown in FIG. 2 at respective times $t_1, t_2, t_3 \ldots t_n$. As described above, algorithms are known to design the RF pulses in different ways, for different purposes. In accordance with the present invention, the RF pulses are designed to have different spatial phase distributions, in contrast to the conventional design, wherein the pulses all have identical phase distributions, or a non-specified phase distribution. In accordance with the invention, as schematically illustrated in FIG. 4, the RF pulses are designed with respective spatial phase distributions $Ph_1$, $Ph_2$, $Ph_3$ ... $Ph_4$, that deviate from a constant phase that is also indicated in FIG. 4. These spatial phase distributions are respectively designed to compensate or mitigate off-resonance effects of the type described above. In particular, the spatial phase distributions are designed to compensate for the off-resonance caused by inhomogeneity of the B0 field. More specifically, $|Ph_n - Ph_{n-1}| \hat{=}$ off-resonance induced by the zero inhomogeneity during the time $t_n - t_{t-n}$.

The train of RF pulses in accordance with the invention is thus designed to counteract the zero field variation effects by locally matching off-resonant spin evolution at discrete time points with a linearly evolving phase of the RF excitation.

Moreover, spatial phase patterns that are generated by the B1 fields respectively radiated by the coils of the transmit array (or B1 fields in combination with gradient fields) should match the phase patterns arising from the B0 field distribution. As noted above, the B0 field distribution is typically intentionally optimized toward uniformity (i.e., so as to be as homogenous as possible) using B0 shim fields, generated by shim coils and/or shim elements. In accordance with the present invention, the dynamic shimming that is produced by shim coils can be altered from shimming that is intended to produce a uniform B0 field, in order to customize the B0 shim to produce a field distribution that can be matched by the B1 field distribution of the applied RF pulses. The B0 shim values (i.e., the current through the shim coils or gradient coils) can be incorporated in accordance with the present invention into the RF pulse design as additional degrees of freedom to be optimized. The pulse designer is thus provided with the joint optimization space of RF channels, gradients ("linear shim terms"), and all available non-linear field variation terms (i.e., shim terms).

The RF pulses designed in accordance with the present invention are particularly suitable for use in spectrally sensitive pulse sequences such as TrueFISP, sequences employing chemically-shift selective pulses, and sequences employing spectral-spatial pulses, which are insensitive due to B0 field variations.

They system computer 20 or the sequence controller 18 shown in FIG. 1 may serve as a processor in which to execute a design algorithm to design pulses and/or shim currents as described above. The result of execution of the design algorithm is a data file that represents the designed pulses or currents in electronic form, in a format that can be incorporated in a pulse sequence used to operate the magnetic resonance apparatus, or a format representing a control instruction.

Although modifications and changes may be suggested by those skilled in the art, it is the intention of the inventors to embody within the patent warranted hereon all changes and modifications as reasonably and properly come within the scope of their contribution to the art.

We claim as our invention:

1. A computerized method for designing radio-frequency (RF) pulses to be radiated in a parallel transmission RF array in a pulse sequence used to operate a magnetic resonance apparatus in which a B0 field is present that exhibits a B0-inhomogeneity that causes off-resonance effects, said method comprising the steps of:

in a computerized processor, executing a design algorithm that designs said RF pulses to respectively radiate B1 fields in said parallel RF transmission array, each B1 field having an associated spatial phase distribution;

in said processor, executing said design algorithm by designing said RF pulses to produce respective associated spatial phase distributions that are non-constant and that differ from each other by a difference that mitigates said off-resonance effect caused by said B0-inhomogeneity; and at an output of said processor, providing a data file that represents the RF pulses designed by execution of said design algorithm, in a form incorporable in said pulse sequence to operate said magnetic resonance apparatus.

2. A method as claimed in claim 1 comprising executing said design algorithm to design said RF pulses in a succession of n pulses having respective associated spatial phase distributions $Ph_n$, with $|Ph_n - Ph_{n-1}| \hat{=}$ off-resonance induced by the zero inhomogeneity during the time $t_n - t_{n-1}$.

3. A method as claimed in claim 1 wherein said magnetic resonance apparatus comprises shim coils respectively supplied with shim currents to produce fields that influence said B0 field, and wherein said method comprises:

in said computerized processor, executing said design algorithm to design said RF pulses using said shim currents as an additional degree of freedom to mitigate said off-resonance effects produced by said B0-inhomogeneity.

4. A method as claimed in claim 3 comprising, in said computerized processor, executing said design algorithm to set said shim currents to cause said B0 field to be non-homogenous to a degree that, in combination with the respective spatial phase distributions associated with said RF pulses, mitigates said off-resonance effect caused by said B0 inhomogeneity.

5. A computerized processor for designing radio-frequency (RF) pulses to be radiated in a parallel transmission RF array in a pulse sequence used to operate a magnetic resonance apparatus in which a B0 field is present that exhibits a B0-inhomogeneity that causes off-resonance effects:

said computerized processor being configured to execute a design algorithm that designs said RF pulses to respectively radiate B1 fields in said parallel RF transmission array, each B1 field having an associated spatial phase distribution;

said computerized processor being configured to execute said design algorithm to design said RF pulses to produce respective associated spatial phase distributions that are non-constant and that differ from each other by a difference that mitigates said off-resonance effect caused by said B0-inhomogeneity; and said computerized processor having an output at which a data file is provided that represents the RF pulses designed by execution of said design algorithm, in a form incorporable in said pulse sequence to operate said magnetic resonance apparatus.

6. A computerized processor as claimed in claim 5 configured to execute said design algorithm to design said RF pulses in a succession of n pulses having respective associated spatial phase distributions $Ph_n$, with $|Ph_n - Ph_{n-1}| \hat{=}$ off-resonance induced by the zero inhomogeneity during the time $t_n - t_{n-1}$.

7. A computerized processor as claimed in claim 5 wherein said magnetic resonance apparatus comprises shim coils respectively supplied with shim currents to produce fields that influence said B0 field, and wherein said method comprises:
said computerized processor is configured to execute said design algorithm to design said RF pulses using said shim currents as an additional degree of freedom to mitigate said off-resonance effects produced by said B0-inhomogeneity.

8. A computerized processor as claimed in claim 7 wherein said computerized processor is configured to execute said design algorithm to set said shim currents to cause said B0 field to be non-homogenous to a degree that, in combination with the respective spatial phase distributions associated with said RF pulses, mitigates said off-resonance effect caused by said B0 inhomogeneity.

9. A method for operating a magnetic resonance apparatus, comprising the steps of:
generating a B0 field in a data acquisition unit of said magnetic resonance apparatus, said B0 field exhibiting a B0-inhomogeneity that causes off-resonance effects;
operating said data acquisition unit to acquire magnetic resonance data from a subject by providing a pulse sequence to said data acquisition unit that causes respective B1 fields, each having a spatial phase distribution associated therewith, to be radiated by a parallel transmission RF array of the data acquisition unit, according to RF pulses in said pulse sequence; and
designing said RF pulses to produce respective associated spatial phase distributions that are non-constant and that differ from each other by a difference that mitigates said off-resonance effect caused by said B0-in homogeneity.

10. A method as claimed in claim 9 comprising designing said RF pulses in a succession of n pulses having respective associated spatial phase distributions $Ph_n$, with $|Ph_n-Ph_{n-1}|\hat{=}$ off-resonance induced by the zero inhomogeneity during the time $t_n-t_{n-1}$.

11. A method as claimed in claim 9 wherein said magnetic resonance apparatus comprises shim coils respectively supplied with shim currents to produce fields that influence said B0 field, and wherein said method comprises:
designing said RF pulses using said shim currents as an additional degree of freedom to mitigate said off-resonance effects produced by said B0-inhornogeneity.

12. A method as claimed in claim 11 comprising setting said shim currents to cause said B0 field to be non-homogenous to a degree that, in combination with the respective spatial phase distributions associated with said RF pulses, mitigates said off-resonance effect caused by said B0 inhomogeneity.

13. A magnetic resonance apparatus comprising:
a data acquisition unit in which a B0 field is generated, said B0 field exhibiting a B0-inhomogeneity that causes off-resonance effects;
a computerized control unit configured to operate said data acquisition unit to acquire magnetic resonance data from a subject by providing a pulse sequence to said data acquisition unit that causes respective B1 fields, each having a spatial phase distribution associated therewith, to be radiated by a parallel transmission RF array of the data acquisition unit; according to RF pulses in said pulse sequence; and
said control unit providing said RF pulses to have a design that produces respective associated spatial phase distributions that are non-constant and that differ from each other by a difference that mitigates said off-resonance effect caused by said B0-inhomogeneity.

14. A magnetic resonance apparatus as claimed in claim 13 wherein said control unit provides said RF pulses in a succession of n pulses having respective associated spatial phase distributions $Ph_n$, with $|Ph_n-Ph_{n-1}|\hat{=}$off-resonance induced by the zero inhomogeneity during the time $t_n-t_{n-1}$.

15. A magnetic resonance apparatus as claimed in claim 14 wherein said control unit is configured to set said shim currents to cause said B0 field to be non-homogenous to a degree that, in combination with the respective spatial phase distributions associated with said RF pulses, mitigates said off-resonance effect caused by said B0 inhomogeneity.

* * * * *